US011769848B2

(12) United States Patent
Lee (10) Patent No.: US 11,769,848 B2
(45) Date of Patent: Sep. 26, 2023

(54) HETEROJUNCTION STRUCTURE-BASED SOLAR CELL AND MANUFACTURING METHOD THEREOF

(71) Applicant: RESEARCH & BUSINESS FOUNDATION SUNGKYUNKWAN UNIVERSITY, Suwon-si (KR)

(72) Inventor: Jaehyeong Lee, Hwaseong-si (KR)

(73) Assignee: RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 86 days.

(21) Appl. No.: 16/951,147

(22) Filed: Nov. 18, 2020

(65) Prior Publication Data

US 2021/0167238 A1    Jun. 3, 2021

(30) Foreign Application Priority Data

Nov. 29, 2019 (KR) .......................... 10-2019-0156644

(51) Int. Cl.
*H01L 31/074* (2012.01)
*H01L 31/18* (2006.01)
*H01L 31/0224* (2006.01)
*H01L 31/0236* (2006.01)

(52) U.S. Cl.
CPC ...... *H01L 31/074* (2013.01); *H01L 31/02363* (2013.01); *H01L 31/022425* (2013.01); *H01L 31/186* (2013.01)

(58) Field of Classification Search
CPC ..... H01L 31/022425; H01L 31/022466; H01L 31/02363; H01L 31/074; H01L 31/186; H01L 31/1868
See application file for complete search history.

(56) References Cited

U.S. PATENT DOCUMENTS

| | | | | |
|---|---|---|---|---|
| 2018/0366597 A1* | 12/2018 | Carlson | ............... | H01L 31/0747 |
| 2019/0341510 A1* | 11/2019 | Kim | ................ | H01L 31/022466 |
| 2020/0161483 A1* | 5/2020 | Yang | ............... | H01L 31/022425 |

FOREIGN PATENT DOCUMENTS

| | | | |
|---|---|---|---|
| KR | 10-2019-0026484 A | * | 3/2019 |
| KR | 10-2019-0026484 A | | 3/2019 |
| KR | 20190053374 A | * | 5/2019 |

OTHER PUBLICATIONS

Machine translation of KR10-2019-0026484A, Lee Gi Won. (Year: 2019).*
Machine translation of KR20190053374A, Youngsung Yan. (Year: 2019).*

(Continued)

*Primary Examiner* — Mayla Gonzalez Ramos
(74) *Attorney, Agent, or Firm* — NSIP Law (57) ABSTRACT

A method for manufacturing a heterojunction structure based solar cell includes preparing an n-type or p-type semiconductor substrate; forming a p-type or n-type non-oxide semiconductor material layer on the n-type or p-type semiconductor substrate to form a p-n junction; forming a transition metal oxide film on the non-oxide semiconductor material layer; and forming a front electrode and a rear electrode. The transition metal oxide layer protects the surface of the non-oxide semiconductor and improves charge extraction.

6 Claims, 4 Drawing Sheets

(56) References Cited

OTHER PUBLICATIONS

Mu, Xinhui, et al. "High efficiency organic/silicon hybrid solar cells with doping-free selective emitter structure induced by a WO3 thin interlayer." *Nano Energy* 16 (2015): (pp. 54-61 in English).
Rahman, M., et al. "Unraveling the electrical properties of solution-processed copper iodide thin films for CuI/n-Si solar cells." *Materials Research Bulletin* 118 (2019): (7 pages in English).
Korean Office Action dated Jan. 22, 2021 in counterpart Korean Patent Application No. 10-2019-0156644 (5 pages in Korean).
Ji et al., "Annealing Effect and Photovoltaic Properties of nano-ZnS/textured p-Si Heterojunction" *Nanoscale Research Letters a SpringerOpen Journal* 2013 (6 pages in English).
Korean Office Action dated Jul. 26, 2021 in counterpart Korean Patent Application No. 10-2019-0156644 (4 pages in Korean).

\* cited by examiner

HETEROJUNCTION STRUCTURE-BASED SOLAR CELL AND MANUFACTURING METHOD THEREOF

CROSS REFERENCE TO RELATED APPLICATIONS

This application claims the benefit under 35 USC § 119(a) of Korean Patent Application No. 10-2019-0156644, filed on Nov. 29, 2019, in the Korean Intellectual Property Office, the entire disclosure of which is incorporated herein by reference for all purposes.

BACKGROUND

1. Field

The present disclosure relates to a manufacturing method of a heterojunction structure solar cell to increase photoelectric conversion efficiency thereof. More particularly, the present disclosure relates to a manufacturing method of a heterojunction structure solar cell increase photoelectric conversion efficiency thereof, in which in a solar cell manufacturing process, a transition metal oxide layer is applied on a transparent conductive non-oxide semiconductor layer to prevent surface damage that may occur when the transparent conductive layer is formed, to prevent an electrical short circuit due to micropores that may occur in the non-oxide semiconductor layer, and to improve extraction of photo-generated charges.

2. Description of Related Art

Conventionally, a non-oxide semiconductor material such as CuI (cupper iodide) has been developed as a material that helps to collect a large amount of electric charge in perovskite-based solar cells. Recently, research of heterojunction between the non-oxide semiconductor material such as CuI and silicon for the solar cell has been conducted.

However, when ITO which is used as a material of a front transparent electrode is deposited using sputtering, damage to a surface of the non-oxide semiconductor material occurs due to collision of high energy particles thereto. As a result, performance of the solar cell may be deteriorated.

Accordingly, there is a need to develop a new structure that may maximize the performance of the solar cell by protecting the surface of the non-oxide semiconductor material and improving extraction of charges generated by light absorption.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

A purpose of the present disclosure is to provide a method of maximizing the performance of the solar cell by forming a transition metal oxide film on the previously reported non-oxide semiconductor/silicon heterojunction-based solar cell to protect the non-oxide semiconductor surface and improve the charge extraction.

Further, a purpose of the present disclosure is to provide a thin film structure for a solar cell structure that may protect the surface of the non-oxide semiconductor and improve the charge extraction, wherein the thin film structure may improve efficiency and performance of solar cells based not only on the non-oxide semiconductor/silicon heterojunction structure, but also based on various structures including the non-oxide semiconductor, and at the same time, a cost of a material of the thin film structure is low and the material of the thin film structure has improved contact characteristics with the transparent electrode and the non-oxide semiconductor layer and exhibits a pinhole effect and lowers a cost of the solar cell because a process of forming the thin film is performed at a low temperature.

A first aspect of the present disclosure provides a method for manufacturing a heterojunction structure based solar cell, the method comprising: preparing an n-type semiconductor substrate; forming a p-type non-oxide semiconductor material layer on the n-type semiconductor substrate to form a p-n junction; forming a transition metal oxide film on the non-oxide semiconductor material layer; and forming a front electrode and a rear electrode.

In one implementation of the first aspect, the method further comprises, after preparing the n-type semiconductor substrate, texturing at least one of a front surface or a rear surface of the n-type semiconductor substrate.

In one implementation of the first aspect, the texturing is performed using a wet or dry etching process.

In one implementation of the first aspect, the p-type non-oxide semiconductor material layer is made of a transparent conductive non-oxide semiconductor material.

In one implementation of the first aspect, the p-type non-oxide semiconductor material layer is formed using one of a vacuum deposition process, an atomic layer deposition process, and a solution coating process.

In one implementation of the first aspect, forming the p-type non-oxide semiconductor material layer includes forming a first p-type non-oxide semiconductor material layer, and forming a second p-type non-oxide semiconductor material layer on the first p-type non-oxide semiconductor material layer, thereby to improve uniformity of the resulting p-type non-oxide semiconductor material layer.

In one implementation of the first aspect, the transition metal oxide film is formed using one of thermal evaporation, e-beam evaporation, and atomic layer deposition.

In one implementation of the first aspect, the transition metal oxide layer protects the non-oxide semiconductor material layer.

In one implementation of the first aspect, forming the front electrode and the rear electrode includes: forming a transparent electrode; and forming a contact electrode.

In one implementation of the first aspect, forming the transition metal oxide film is performed at room temperature.

A second aspect of the present disclosure provides a method for manufacturing a heterojunction structure based solar cell, the method comprising: preparing a p-type semiconductor substrate; forming a n-type non-oxide semiconductor material layer on the p-type semiconductor substrate to form a p-n junction; forming a transition metal oxide film on the non-oxide semiconductor material layer; and forming a front electrode and a rear electrode.

In one implementation of the second aspect, the method further comprises, after preparing the p-type semiconductor substrate, texturing at least one of a front surface or a rear surface of the p-type semiconductor substrate.

In one implementation of the second aspect, the n-type non-oxide semiconductor material layer is made of a transparent conductive non-oxide semiconductor material.

In one implementation of the second aspect, forming the transition metal oxide film is performed at room temperature.

A third aspect of the present disclosure provides a heterojunction structure based solar cell comprising: an n-type semiconductor substrate; a p-type non-oxide semiconductor material layer formed on the n-type semiconductor substrate to form a p-n junction; a transition metal oxide film on the non-oxide semiconductor material layer; a front electrode on the transition metal oxide film; and a rear electrode opposite to the front electrode.

In one implementation of the third aspect, at least one of a front surface or a rear surface of the n-type semiconductor substrate is textured.

In one implementation of the third aspect, the p-type non-oxide semiconductor material layer is made of a transparent conductive non-oxide semiconductor material.

In one implementation of the third aspect, the transition metal oxide layer protects the non-oxide semiconductor material layer.

In one implementation of the third aspect, a thickness of the p-type non-oxide semiconductor material layer is in a range of 20 to 30 nm.

In one implementation of the third aspect, a thickness of the transition metal oxide film is 10 nm or smaller.

A fourth aspect of the present disclosure provides a heterojunction structure based solar cell comprising: a p-type semiconductor substrate; an n-type non-oxide semiconductor material layer formed on the p-type semiconductor substrate to form a p-n junction; a transition metal oxide film on the non-oxide semiconductor material layer; a front electrode on the transition metal oxide film; and a rear electrode disposed opposite to the front electrode.

In one implementation of the fourth aspect, at least one of a front surface or a rear surface of the p-type semiconductor substrate is textured.

In one implementation of the fourth aspect, the transition metal oxide layer protects the non-oxide semiconductor material layer.

Effects in accordance with the present disclosure may be as follows but may not be limited thereto.

According to the present disclosure, in the solar cell manufacturing method, the transition metal oxide layer made of a tungsten oxide is applied on the heterojunction structure of the solar cell. The transition metal oxide layer may protect the surface of the non-oxide semiconductor and improve the charge extraction. Thus, the performance of solar cells based on various structures including the non-oxide semiconductor as well as the performance of the non-oxide semiconductor/silicon heterojunction-based solar cell may be improved.

Further, a cost of the material of the transition metal oxide layer is inexpensive and the transition metal oxide layer is formed at a low temperature, such that a cost of the resulting solar cell is expected to be lowered.

In addition to the effects as described above, specific effects in accordance with the present disclosure will be described together with the detailed description for carrying out the disclosure.

BRIEF DESCRIPTIONS OF DRAWINGS

The above and other purpose and features will become apparent from the following description with reference to the following figures, wherein like reference numerals refer to like parts throughout the various figures unless otherwise specified.

DETAILED DESCRIPTIONS

For simplicity and clarity of illustration, elements in the figures are not necessarily drawn to scale. The same reference numbers in different figures represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
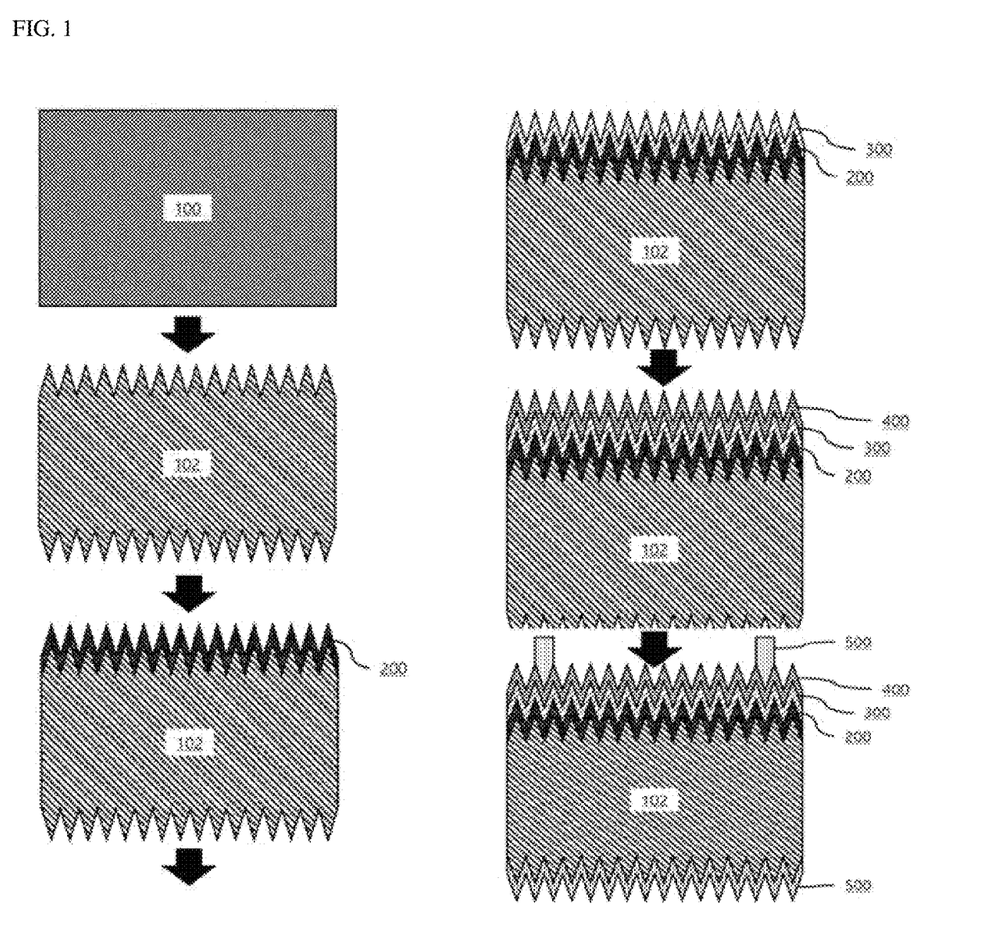
FIG. 1 shows a schematic diagram of a manufacturing method of a solar cell based on a heterojunction structure according to an embodiment of the present disclosure.
Figure 2:
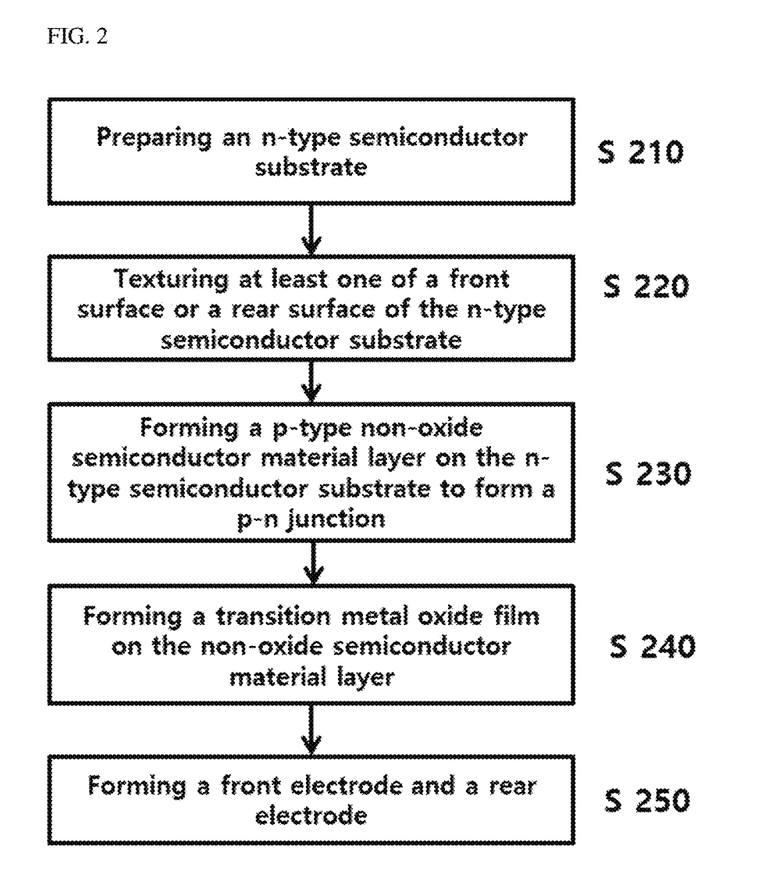
FIG. 2 shows a flow chart of a manufacturing method of a solar cell based on a heterojunction structure according to an embodiment of the present disclosure.

FIG. 1 shows a schematic diagram of a manufacturing method of a solar cell based on a heterojunction structure according to an embodiment of the present disclosure. FIG. 2 shows a flow chart of a manufacturing method of a solar cell based on a heterojunction structure according to an embodiment of the present disclosure. With reference to these drawings, the present disclosure will be described below.

A method for manufacturing a heterojunction structure based solar cell according to an embodiment of the present disclosure may include preparing an n-type semiconductor substrate (S 210); forming a p-type non-oxide semiconductor material layer on the n-type semiconductor substrate to form a p-n junction (S 230); forming a transition metal oxide film on the non-oxide semiconductor material layer (S 240); and forming a front electrode and a rear electrode (S250).

In step S210, an n-type semiconductor substrate is prepared. A semiconductor substrate 100 is prepared. In this connection, a silicon substrate widely used in a semiconductor process may be used as the substrate 100. Typically, a doped silicon substrate having a resistance of 1.5 Ω-cm may be used. However, the disclosure is not limited thereto. For example, a semiconductor material having a band gap similar to that of the silicon substrate may be used.

The method may further include step S220 after step S210, where step S220 includes texturing at least one of front and rear faces of the n-type semiconductor substrate.

In step S220, a wet or dry etching process used in a solar cell process may be used to form a texturing structure on a surface of the substrate 100. In this connection, the texturing structure may have a shape such as a triangle, an oval, or a pyramid. The shape of the texturing structure may not be fixed, and may vary based on a structure and a performance of the solar cell.

In step S230, the p-type non-oxide semiconductor material layer is formed on the n-type semiconductor substrate to form the p-n junction. Prior to the formation of the p-type non-oxide semiconductor material layer, the front and rear faces of the textured wafer may be passivated to prevent carrier recombination on the surface thereof. A passivation method includes a very thin silicon oxide film formation, an amorphous silicon film formation, and an H-termination method, etc.

The p-type non-oxide semiconductor material layer is made of a transparent conductive non-oxide semiconductor material. For example, the non-oxide semiconductor may include a material such as CuI that may have high transparency and may form a p-n junction when being bonded to the substrate 100.

The p-type non-oxide semiconductor material layer may be formed using any one of a vacuum deposition method, an atomic layer deposition method, and a solution coating method.

In step S240, the transition metal oxide film is formed on the non-oxide semiconductor material layer. A type of the transition metal oxide film may be selected from $WO_3$, $MoO_3$, $V_xO_y$, or the like based on a doping type of the non-oxide semiconductor. In addition, since light transmittance of the transition metal oxide film should be high, it is preferable that a thickness of the transition metal oxide film is within 10 nm. When the thin film on the heterojunction-structure is formed using a RF sputtering method, the non-oxide semiconductor surface may be damaged by plasma. Thus, it is preferable to form the transition metal oxide film using any one of a thermal evaporation method, an e-beam evaporation method, and an atomic layer deposition method.

The transition metal oxide layer may protect the non-oxide semiconductor material layer. Therefore, the solar cell device according to the present disclosure may be very thin because the non-oxide semiconductor material layer is protected by the transition metal oxide layer.

In step S250, the front electrode and the rear electrode are formed. Forming the front electrode and the rear electrode may include forming a transparent electrode; and forming a contact electrode.

In forming the transparent electrode and forming the contact electrode, the transparent electrode 400 may be made of various materials such as ITO and FTO. However, the disclosure is not limited thereto. A thickness thereof may be about 100 nm. The formation method thereof may include solution coating, RF sputter, thermal evaporation, e-beam evaporation, and the like. The contact electrode may form an upper electrode and a lower electrode. The upper electrode may be formed in a grid form using a shadow mask or a mask aligner. The lower electrode may be formed over an entire area.

In the manufacturing method of the heterojunction structure based solar cell according to the present disclosure, the transition metal oxide thin film 300 may be deposited using a vacuum deposition method. During the deposition, the substrate may be heated. However, the substrate is not usually heated to avoid affecting the underlying thin film. Therefore, the transition metal oxide thin film 300 may be formed at room temperature. Thus, the solar cell manufacturing cost may be lowered.

An embodiment in which the p-n junction is formed via formation of the p-type non-oxide semiconductor material layer on the n-type semiconductor substrate has been described above. However, the present disclosure is not limited thereto. The p-n junction may be formed by preparing a p-type semiconductor substrate and then forming an n-type non-oxide semiconductor material layer (e.g., CdS, ZnS, etc.) thereon. The heterojunction structure based solar cell having the p-n junction obtained in this way may be manufactured in the same way as described above.

The manufacturing method of the heterojunction structure based solar cell has been described above. Hereinafter, the thus manufactured heterojunction structure based solar cell will be described. Overlapping descriptions therebetween will be omitted.

Figure 3:
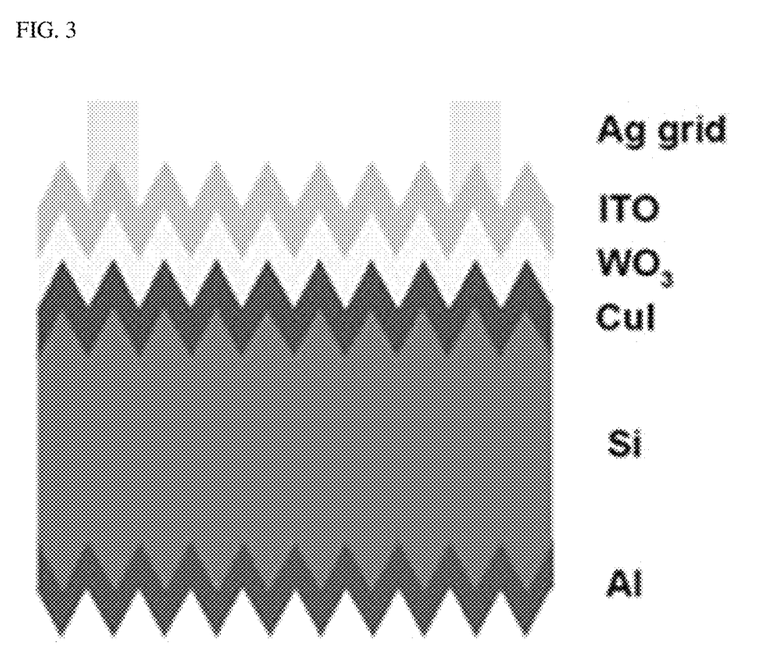
FIG. 3 is a schematic diagram of a solar cell based on a heterojunction structure according to an embodiment of the present disclosure as manufactured according to an Example of the present disclosure.

The heterojunction structure based solar cell according to an embodiment of the present disclosure includes the n-type semiconductor substrate 102; the p-type non-oxide semiconductor material layer 200 formed on the n-type semiconductor substrate 102 to form the p-n junction; the transition metal oxide film 300 on the non-oxide semiconductor material layer 200; and the front electrode 400 on the transition metal oxide film; and the rear electrode 500 opposite to the front electrode.

At least one of the front and rear faces of the n-type semiconductor substrate may be textured.

The p-type non-oxide semiconductor material layer is made of a transparent conductive non-oxide semiconductor material. It is preferable that a thickness of the p-type non-oxide semiconductor material layer is 20 to 30 nm.

The transition metal oxide layer protects the non-oxide semiconductor material layer. The thickness of the transition metal oxide film is preferably 10 nm or smaller, such that a transmittance thereof is high.

Hereinafter, the present disclosure will be additionally described together with specific Examples.

Example 1

We manufactured a $WO_3$/CuI/Si heterojunction structure based solar cell to increase conversion efficiency thereof. The solar cell manufacturing method included texturing an n-type silicon substrate; forming a p-type non-oxide semiconductor material layer made of CuI on the textured n-type silicon substrate to form a p-n junction; forming a transition metal oxide film made of $WO_3$ on the formed p-n junction; and forming a transparent electrode, and forming a contact electrode.

The n-type doped silicon substrate was used. A front surface and a rear surface of the substrate was textured using a wet or dry etching process.

Forming the transition metal oxide layer included, prior to forming the transition metal oxide layer, heating CuI powders contained in a tungsten boat of the vacuum deposition equipment and depositing a further CuI layer on the silicon wafer at a deposition rate of 1 Å/S; and then forming the transition metal oxide layer made of $WO_3$ on the further CuI layer.

The transition metal oxide film was formed as follows. A silicon wafer was placed in vacuum deposition equipment. The transition metal oxide material $WO_3$ was contained in a boat made of a high melting point material. A chamber of the vacuum deposition equipment was brought into a high vacuum environment. A $WO_3$ thin film as the transition metal oxide film was formed on the CuI thin film at an oxygen percentage of 30%. The $WO_3$ thin film had a thickness of 10 nm.

A schematic diagram of the heterojunction structure based solar cell according to an embodiment of the present disclosure as produced in Example 1 is shown in FIG. 3.

Figure 4:
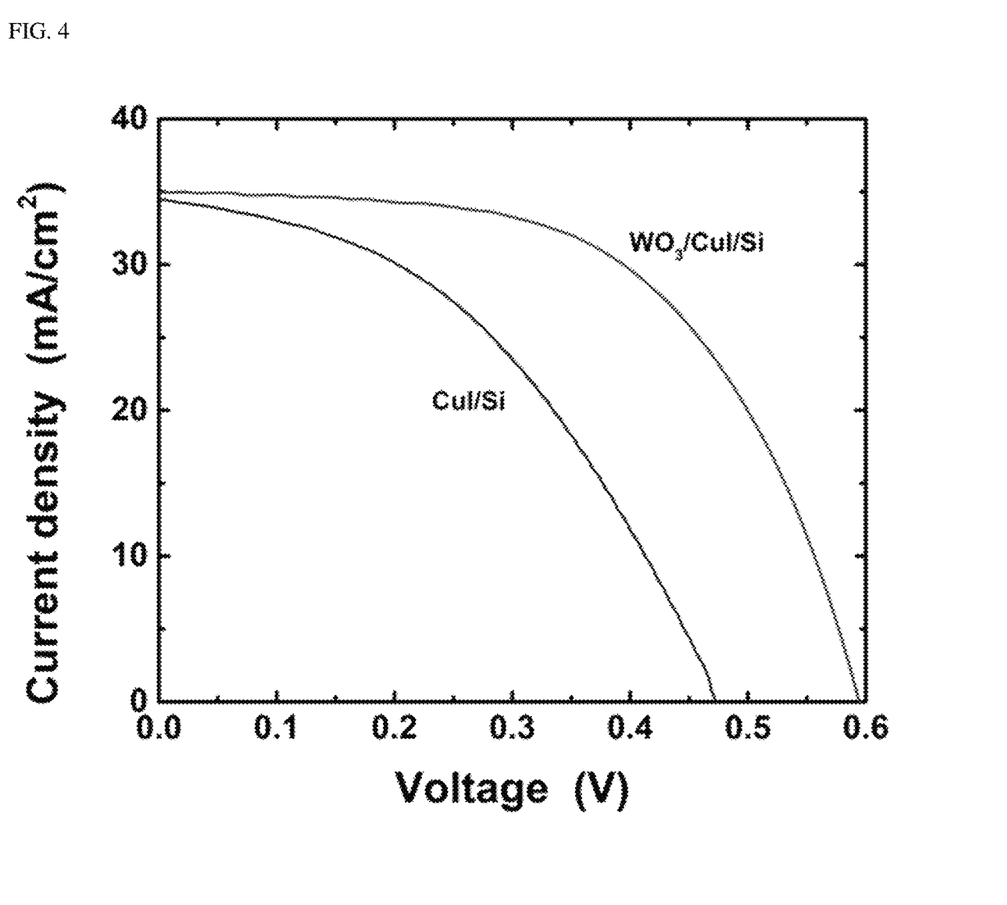
FIG. 4 is a graph showing performance evaluation of a solar cell based on whether a transition metal oxide layer is formed after a solar cell based on a heterojunction structure is fabricated according to an embodiment of the present disclosure.

Before forming the ITO transparent electrode on the non-oxide semiconductor (CuI)/silicon (Si) heterojunction structure, the transition metal oxide film made of $WO_3$ was formed on the heterojunction structure. A following Table 1 and FIG. 4 show comparative experimental data of performance evaluation of the solar cell based on presence or absence of the $WO_3$ transition metal oxide film. More specifically, a $WO_3$/CuI/Si heterojunction structure based solar cell to increase the conversion efficiency according to the present disclosure, and a CuI/Si heterojunction structure based solar cell without the $WO_3$ transition metal oxide were manufactured. FIG. 4 and Table 1 show the comparison result of the performance evaluations of the $WO_3$/CuI/Si heterojunction structure based solar cell and the CuI/Si heterojunction structure based solar cell without the $WO_3$ transition metal oxide.

TABLE 1

| Solar cells | Open circuit voltage ($V_{oc}$) (V) | Short circuit current density ($J_{sc}$) (mA/cm$^2$) | Fill factor (FF) (%) | Photoelectric conversion efficiency PCE (%) |
|---|---|---|---|---|
| W/O $WO_3$ interlayer | 0.471 | 34.44 | 42.71% | 6.93% |
| With $WO_3$ interlayer | 0.595 | 34.97 | 57.16% | 11.89% |

In terms of the performance result of the $WO_3$/CuI/Si heterojunction structure based solar cell, the open-circuit voltage $V_{oc}$(V) was 0.595(V), the fill factor (FF) was 57.16%, and the photoelectric conversion efficiency (PCE) was 11.89% which was about twice as much as the PCE of the CuI/Si heterojunction structure based solar cell without the $WO_3$ transition metal oxide.

Thus, in the $WO_3$/CuI/Si heterojunction structure based solar cell according to the present disclosure, it was identified based on the photocurrent-voltage characteristic measurement that the open-circuit voltage (Voc) and the fill factor (FF) increased. Thus, it was identified that the conversion efficiency of the solar cell was improved by about two times. As a result, according to the manufacturing method of the $WO_3$/CuI/Si heterojunction structure based solar cell according to the present disclosure, the transition metal oxide layer made of the tungsten oxide is applied on the heterojunction structure of the solar cell. The transition metal oxide layer may protect the surface of the non-oxide semiconductor and improve the charge extraction. Thus, the performance of solar cells based on various structures including the non-oxide semiconductor as well as the performance of the non-oxide semiconductor/silicon heterojunction-based solar cell may be improved. Further, a cost of the material of the transition metal oxide layer is inexpensive and the transition metal oxide layer is formed at a low temperature, such that a cost of the resulting solar cell is expected to be lowered.

It will be understood that although the above disclosure has been described with reference to the preferred embodiment of the present disclosure, those skilled in the art may achieve modifications and changes thereto within a range that does not deviate from the spirit and region of the present disclosure as described in the following claims.

What is claimed is:

1. A method for manufacturing a heterojunction structure based solar cell, the method comprising:
preparing an n-type semiconductor substrate;
texturing at least one of a front surface or a rear surface of the n-type semiconductor substrate;
forming a p-type non-oxide semiconductor material layer of CuI on the n-type semiconductor substrate to form a p-n junction;
forming a transition metal oxide film directly on the p-type non-oxide semiconductor material layer of CuI; and
forming a front electrode and a rear electrode,
wherein the transition metal oxide layer protects the p-type non-oxide semiconductor material layer of CuI,
wherein the transition metal oxide film is formed using one of thermal evaporation, e-beam evaporation, and atomic layer deposition, and
wherein a thickness of the transition metal oxide film is smaller than 10 nm.

2. The method of claim 1, wherein the p-type non-oxide semiconductor material layer of CuI is made of a transparent conductive non-oxide semiconductor material.

3. The method of claim 1, wherein the p-type non-oxide semiconductor material layer is formed using one of a vacuum deposition process, an atomic layer deposition process, and a solution coating process.

4. The method of claim 1, wherein forming the p-type non-oxide semiconductor material layer includes forming a first p-type non-oxide semiconductor material layer of CuI, and forming a second p-type non-oxide semiconductor material layer of CuI on the first p-type non-oxide semiconductor material layer of CuI, thereby to improve uniformity of the resulting p-type non-oxide semiconductor material layer.

5. The method of claim 1, wherein forming the front electrode and the rear electrode includes:
forming a transparent electrode; and
forming a contact electrode.

6. The method of claim 1, wherein the transition metal oxide film comprises a transition metal oxide selected from the group consisting of $WO_3$, $MoO_3$, and $V_xO_y$.

* * * * *